(12) United States Patent
Kawai et al.

(10) Patent No.: US 8,306,239 B2
(45) Date of Patent: Nov. 6, 2012

(54) PUBLIC-ADDRESS SYSTEM

(75) Inventors: Yuma Kawai, Kobe (JP); Koji Kawaguchi, Kobe (JP)

(73) Assignee: TOA Corporation, Kobe-Shi, Hyogo-Ken (JP)

( * ) Notice: Subject to any disclaimer, the term of this patent is extended or adjusted under 35 U.S.C. 154(b) by 167 days.

(21) Appl. No.: 12/677,593

(22) PCT Filed: Sep. 3, 2008

(86) PCT No.: PCT/JP2008/065851
§ 371 (c)(1),
(2), (4) Date: Mar. 11, 2010

(87) PCT Pub. No.: WO2009/034889
PCT Pub. Date: Mar. 19, 2009

(65) Prior Publication Data
US 2010/0189278 A1   Jul. 29, 2010

(30) Foreign Application Priority Data
Sep. 13, 2007   (JP) .................... 2007-237837

(51) Int. Cl.
*H04R 27/00*   (2006.01)
(52) U.S. Cl. .......................................... 381/82
(58) Field of Classification Search ........... 381/82
See application file for complete search history.

(56) References Cited

U.S. PATENT DOCUMENTS 5,818,328 A * 10/1998 Anderson et al. ........ 340/384.72
2001/0033190 A1   10/2001 Bendall
2006/0182288 A1 * 8/2006 Arcaria et al. .................. 381/82

FOREIGN PATENT DOCUMENTS

| JP | 3-108907 A | 5/1991 |
|----|----|----|
| JP | 04-067782 | 3/1992 |
| JP | 11-187495 | 4/1999 |
| JP | 2004-112161 | 9/2002 |

(Continued)

OTHER PUBLICATIONS

Tittle: To float or not float; Publisher: Associated Power Technologies.*

(Continued)

*Primary Examiner* — Devona Faulk
*Assistant Examiner* — David Ton
(74) *Attorney, Agent, or Firm* — Duane Morris LLP

(57) ABSTRACT

[Object]
To downsize a power amplifier, while keeping isolation between a transmission line and ground potential.
[Means to Realize Object]
Two terminals (2a, 2b) of an audio signal source (2) are connected to an input of an isolation input circuit (6). An audio signal developed, being isolated from the input-side, between two output-side terminals (6a, 6b) of the isolation input circuit (6) are inputted to a power amplifying stage (12). The power amplifying stage (12) amplifies the audio signal and outputs it at a high voltage from two output terminals (12c, 12d) to a plurality of loudspeakers (22) without using an insulation transformer. Operating power is supplies to the power amplifying stage (12) from two power supply terminals (20c, 20d) of a DC power supply (14). One (6d) of the terminals of the insulation input circuit (6), one (12d) of the output terminals of the power amplifying stage (12) and one (20d) of the power supply terminals of the DC power supply (14) are connected together to provide a common potential point different from the ground potential.

3 Claims, 2 Drawing Sheets

FOREIGN PATENT DOCUMENTS

| | | | |
|---|---|---|---|
| JP | 2004-129018 | | 4/2004 |
| JP | 2004129018 A | * | 4/2004 |
| JP | 2005-236349 | | 9/2005 |
| JP | 2005236349 A | * | 9/2005 |

OTHER PUBLICATIONS

International Search Report and Written Opinion dated Nov. 19, 2008 from corresponding application No. PCT/JP2008/065851.

Revised New Edition of PA Audio System edited by Shigeo Fujioka, published by Kogaku Tosho Shuppan KK (4 pages), First Edition: Oct. 20, 1996.

Revised New Edition of PA Audio System edited by Shigeo Fujioka, published by Kogaku Tosho Shuppan KK First Edition: Oct. 20, 1996, Second Edition: Jun. 1, 2000 (4 pages).

Office Action dated Apr. 20, 2012 in corresponding Japanese Application No. 2007-237837.

Supplemental European Search Report dated Apr. 12, 2012 in corresponding European Patent Application No. 08830079.3-1233/ 21900114, 8 pages.

* cited by examiner

PUBLIC-ADDRESS SYSTEM

TECHNICAL FIELD

This invention relates to a public-address system and, more particularly, to such system having a high impedance output.

BACKGROUND ART

Some public-address system include high-impedance connection of a power amplifier to a plurality of loudspeakers, as disclosed in Non-patent Literature 1. In high-impedance connection, a voice coil of each loudspeaker is connected in a secondary side of a matching transformer. The impedance of the secondary side is made to match with the impedance of the voice coil. The impedance of the primary side of the matching transformer is chosen to be high. The primary sides of these matching transformers are connected in parallel via a set of transmission lines, and, then, connected to the output of the power amplifier. The output impedance of the power amplifier is made to mach with the parallel impedance of the parallelly connected matching transformers, and the power amplifier is adapted to provide a high output voltage. With this arrangement, loss in the transmission lines can be reduced.

Non-Patent Literature 1: Revised New Edition of PA Audio System edited by Shigeo Fujioka, published by Kogaku Tosho Shuppan K K, Page 200

DISCLOSURE OF THE INVENTION

Problem to Be Solved by the Invention

Usually, an output transformer is used for obtaining a high output voltage from a power amplifier. The use of the output transformer can prevent large current from flowing to the ground through the power amplifier even when a transmission line is struck by lightning, for example. However, since the output transformer needs to reproduce audio signals having frequencies of from 20 Hz to 20 KHz, the core of the output transformer is large, and, as a result, the power amplifier must be large-sized.

An object of the present invention is to provide a small-sized power amplifier, while maintaining isolation between a transmission line and the ground potential, in a high-impedance public-address system.

Means to Solve the Problem

A public-address system according to an aspect of the present invention includes an audio signal source. The audio signal source outputs an audio signal between two terminals thereof. One of the two terminals is grounded. The two terminals of the audio signal source are connected to the input side of isolation input means. The isolation input means has two output-side terminals, between which the audio signal is developed, being isolated from the said input side. The audio signal is inputted to power amplifying means from the two output-side terminals of the isolation input means. The power amplifying means amplifies the audio signal inputted thereto and develops the amplified audio signal at a high voltage between two output terminals. The power amplifying means has an output side which is transformerless (i.e. uses no isolation transformer). A plurality of loudspeakers are connected in parallel with each other between the two output terminals of the power amplifying means. DC power supply means supplies operating power to the power amplifying means. The DC power supply means has two power supply terminals, through which operating power is supplied to the power amplifying means. One of the terminals of the isolation input means, one of the output terminals of the power amplifying means and one of the power supply terminals of the DC power supply means are connected together to provide a common potential point which is different from the said ground potential.

The power amplifying means of the public-address system with the above-described arrangement is isolated from the ground potential in its input-side since one of the terminals of the isolated input means, one of the output terminals of the power amplifying means and one of the power supply terminals of the DC power supply means are connected together to provide a common potential point, which is different from the ground potential. This can eliminate the need for using a transformer in the output-side, which makes it possible to use small-sized power amplifying means.

The isolation input means may be a transformer. The transformer has its primary winding connected between the two terminals of the audio signal source, and has its secondary winding connected to the two output-side terminals of the isolation input means. The isolation input means may include light-emitting means emitting light in accordance with an audio signal from the audio signal source, and light-receiving means providing an electrical signal in response to the reception of light from the light-emitting means.

BEST MODE FOR CARRYING OUT THE INVENTION

Figure 1:
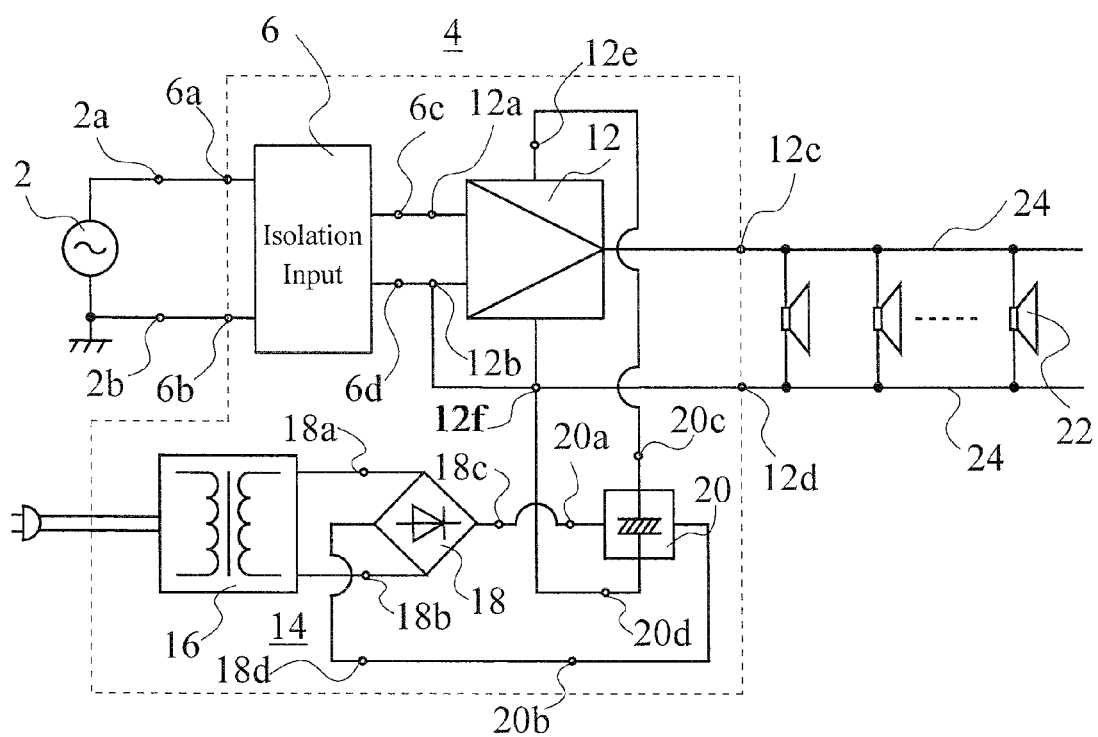
FIG. 1 is a block diagram of a public-address system according to one embodiment of the present invention.

A public-address system according to one embodiment of the present invention includes an audio signal source 2 as shown in FIG. 1. A microphone, for example, may be used as the audio signal source 2. The audio signal source 2 provides an audio signal between two terminals 2a and 2b. One, 2b, of the terminals is grounded.

The terminals 2a and 2b of the audio signal source 2 are connected to isolation input means of a power amplifier 4, e.g. two input terminals 6a and 6b of an isolation input circuit 6. The input terminals 6a and 6b serve also as input terminals of the power amplifier 4. The isolation input circuit 6 has two output terminals 6c and 6d, too.

Figure 2:
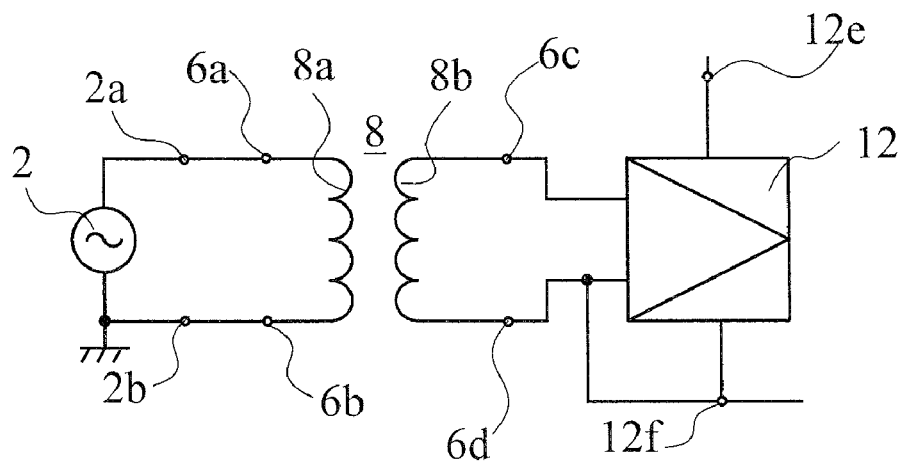
FIG. 2 is a block diagram of an example of an isolation input circuit used in the public-address system of FIG. 1.

The isolation input circuit 6 may be composed of a transformer 8 like the one shown in FIG. 2. The transformer 8 has a primary winding 8a and a secondary winding 8b. The two ends of the primary winding 8a are connected to the input terminals 6a and 6b, respectively, and the two ends of the secondary winding 8b are connected respectively to the output terminals 6c and 6d. Neither of the output terminals 6c and 6d is connected to the input terminal 6a or 6b. Accordingly, an audio signal is outputted between the output terminals 6c and 6d, being isolated from the primary winding 8a.

Figure 3:
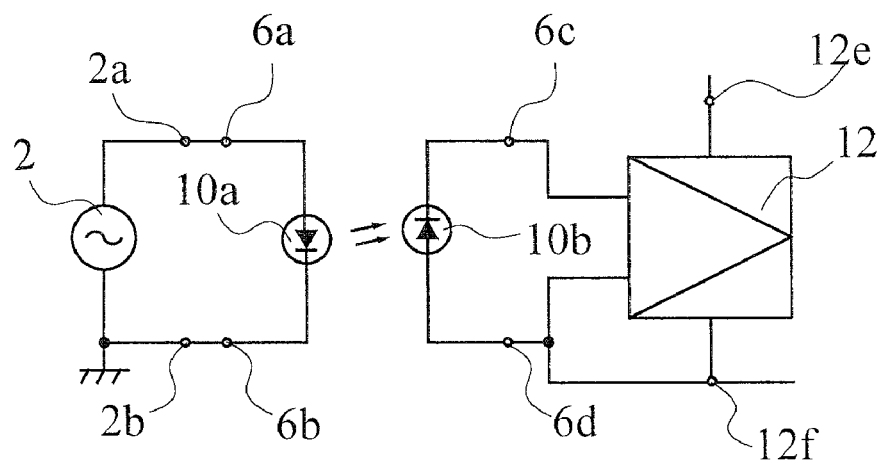
FIG. 3 is a block diagram of another example of an isolation input circuit used in the public-address system of FIG. 1.

Alternatively, the isolation input circuit 6 may be composed of a light-emitting device, e.g. a light-emitting diode 10a, and a light-receiving device, e.g. a photodiode 10b, as shown in FIG. 3. Specifically, the light-emitting diode 10a has its two ends connected to the input terminals 6a and 6b, respectively, and emits light in response to the flow of the audio signal therethrough. The emitted light is received by the photodiode 10b connected between the output terminals 6c and 6d, causing current to flow therethrough. Neither of the output terminals 6c and 6d is connected to the input terminal 6a or 6b. Accordingly, an audio signal is outputted between the output terminals 6c and 6d, being isolated from the primary winding 8a. It should be noted that, although a bias circuit is actually provided for each of the light-emitting diode 10a and the photodiode 10b, they are not shown in FIG. 3 since such is known. A photocoupler may be used as the light-emitting diode 10a and photodiode 10b.

The audio signal developed between the two output terminals 6c and 6d of the isolation input circuit 6 is applied to two input terminals 12a and 12b of power amplifying means, e.g. a power amplifying stage 12. The power amplifying stage 12 is of an OTL configuration, which does not include an output transformer, for power amplification and develops a high output voltage between two output terminals 12c and 12d thereof. The output terminals 12c and 12d are also output terminals of the power amplifier 4, and the output terminal 12d is connected to the input terminal 12b. A power amplifying stage of various types may be used as the power amplifying stage 12. For example, an analog power amplifying stage, e.g. a Class AB or Class B power amplifying stage, may be used, or a Class D switching-type power amplifier may be used.

The power amplifying stage 12 has power supply input terminals 12e and 12f. A DC power supply 14 is provided for supplying operating power to the power supply input terminals 12e and 12f. The DC power supply 14 has a transformer 16 for transforming commercial AC power. The commercial AC voltage is voltage-transformed, and the voltage-transformed commercial AC voltage is induced in the secondary side of the transformer 16. The induced commercial AC voltage is isolated from the ground potential, and is applied between two input terminals 18a and 18b of rectifying means, e.g. a rectifying bridge circuit 18, which results in a rectified voltage developed between two output terminals 18c and 18d. This rectified voltage is applied between two input terminals 20a and 20b of a smoothing circuit 20 including a plurality of smoothing capacitors and smoothing reactors, for example, so that a smoothed DC voltage is developed at a power supply terminal, or between two power supply output terminals 20c and 20d, for example. The power supply output terminal 20c of the smoothing circuit 20 is connected to the power supply input terminal 12e of the power amplifying stage 12, and the power supply output terminal 20d is connected to the power supply input terminal 12f, which, in turn, is connected to the output terminal 12d and the input terminal 12b. Thus, the smoothing circuit 20 and the power amplifying stage 12 operate on the output terminal 20d serving as a reference potential, and, thus, does not operate on the ground potential serving as a reference potential.

A plurality of loudspeakers 22 are connected in parallel between the output terminals 12c and 12d of the power amplifying stage 12 via a pair of transmission lines 24. Although not shown, the loudspeakers 22 have their voice coils connected to the secondary sides of their matching transformers, and the primary sides of the matching transformers are connected together via the transmission lines 24. Since one of the terminals of the primary side of each matching transformer is connected to the output terminal 12d, each loudspeaker 22 operates on the power supply output terminal 20d of the smoothing circuit 20 serving as a reference potential and, thus, does not operate on the ground potential serving as a reference potential.

The transmission lines 24, the power amplifying stage 12 and the smoothing circuit 20 of the public-address system with the above-described arrangement do not operate on the ground potential, and thus are isolated from the ground potential by the isolation input circuit 6 disposed in the input side of the power amplifying stage 12. Accordingly, even when the transmission lines 24 are struck by lightning, it does not occur that large current flows to the ground potential, so that a required breakdown resistance can be secured. In addition, since the securing of this breakdown-withstanding voltage is realized by the use of the isolation input circuit 6 disposed on the input side of the power amplifying stage 12, there is no need to use a transformer in the output side of the power amplifying stage 12, which makes it possible to downsize the power amplifier 4 using the power amplifying stage 12.

The invention claimed is:

1. A public-address system comprising:
an audio signal source providing an audio signal between two terminals, one of said two terminals being connected to a ground potential;
isolation input means having an input side to which the two terminals of said audio signal source are connected, said audio signal being developed between two terminals on an output side of said isolation input means while being isolated from said input side;
power amplifying means to which said audio signal is inputted from said two terminals on said output side of said isolation input means, said power amplifying means amplifying said audio signal and outputting the amplified audio signal at a high voltage from two output terminals thereof without using an isolation transformer;
a plurality of loudspeakers connected in parallel with each other between transmission lines provided respectively for said two output terminals of said power amplifying means; and
DC power supply means having two ungrounded power supply terminals, generating operating power from a commercial AC power supply, and supplying said operating power to said power amplifying means through said two power supply terminals;
one of said terminals on said output side of said isolation input means, one of said output terminals of said power amplifying means and one of said power supply terminals of said DC power supply means being connected together to provide a common point of potential, different from said ground potential, for said output side of said isolation input means, said power amplifying means and said DC power supply means, wherein said output side of said isolation input means, said power amplifying means and said DC power supply means operate with reference to the potential at said common potential point, which serves as a reference potential therefor.

2. The public-address system according to claim 1, wherein said isolation input means comprises a transformer having its primary winding connected between said two terminals of said audio signal source and having its secondary winding connected to said output-side two terminals.

3. The public-address system according to claim 1, wherein said isolation input means comprises light-emitting means emitting light in accordance with an audio signal from said audio signal source, and light-receiving means receiving light from said light-emitting means and providing an electrical signal in response to the received light.

* * * * *